United States Patent
Ashida et al.

(10) Patent No.: US 10,685,683 B2
(45) Date of Patent: Jun. 16, 2020

(54) MAGNETIC RECORDING ARRAY AND MAGNETIC RECORDING DEVICE

(71) Applicant: TDK CORPORATION, Tokyo (JP)

(72) Inventors: Takuya Ashida, Tokyo (JP); Tatsuo Shibata, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/292,959

(22) Filed: Mar. 5, 2019

(65) Prior Publication Data

US 2020/0105310 A1    Apr. 2, 2020

(30) Foreign Application Priority Data

Sep. 28, 2018  (JP) .................. 2018-184774

(51) Int. Cl.
| | |
|---|---|
| *G11C 5/08* | (2006.01) |
| *G11C 11/16* | (2006.01) |
| *H01L 43/08* | (2006.01) |
| *H01L 43/10* | (2006.01) |
| *H01L 27/22* | (2006.01) |

(52) U.S. Cl.
CPC .............. *G11C 5/08* (2013.01); *G11C 11/161* (2013.01); *H01L 27/228* (2013.01); *H01L 43/08* (2013.01); *H01L 43/10* (2013.01); *H01L 27/224* (2013.01)

(58) Field of Classification Search
CPC .......... G11C 5/08; G11C 11/161; H01L 43/08
USPC ........................................................ 365/158
See application file for complete search history.

(56) References Cited

U.S. PATENT DOCUMENTS

| | | | | |
|---|---|---|---|---|
| 2011/0297909 | A1* | 12/2011 | Fukami | ................... G11C 11/16 257/1 |
| 2012/0278582 | A1* | 11/2012 | Fukami | ................... G11C 11/16 711/166 |
| 2016/0276031 | A1 | 9/2016 | Abe et al. | |
| 2016/0284980 | A1* | 9/2016 | Tonegawa | ............... H01L 43/02 |
| 2017/0117027 | A1 | 4/2017 | Braganca et al. | |
| 2018/0190899 | A1* | 7/2018 | Kim | ................... G11C 11/1659 |

FOREIGN PATENT DOCUMENTS

| | | |
|---|---|---|
| JP | 2004-153182 A | 5/2004 |
| JP | 2016-157815 A | 9/2016 |
| JP | 2016-178252 A | 10/2016 |
| JP | 2017-112359 A | 6/2017 |

* cited by examiner

*Primary Examiner* — Anthan Tran

(74) *Attorney, Agent, or Firm* — Oliff PLC

(57) ABSTRACT

A magnetic recording array includes: a plurality of domain wall moving elements; a first wiring which is electrically connected to a reference potential and is electrically connected to at least one domain wall moving element of the plurality of domain wall moving elements; a second wiring which is electrically connected to at least two or more domain wall moving elements of the plurality of domain wall moving elements; a first switching element which is connected between each of the domain wall moving elements and the first wiring; and a second switching element which is connected between each of the domain wall moving elements and the second wiring, wherein an OFF resistance of the first switching element is smaller than an OFF resistance of the second switching element.

12 Claims, 3 Drawing Sheets

MAGNETIC RECORDING ARRAY AND MAGNETIC RECORDING DEVICE

TECHNICAL FIELD

The present disclosure relates to a magnetic recording array and a magnetic recording device. Priority is claimed on Japanese Patent Application No. 2018-184774 filed on Sep. 28, 2018, the content of which is incorporated herein by reference.

BACKGROUND ART

A next-generation non-volatile memory which will replace a flash memory or the like having a limitation in miniaturization has gained attention. For example, MRAM (Magnetoresistive Random Access Memory), ReRAM (Resistance Random Access Memory), PCRAM (Phase Change Random Access Memory), and the like are known as the next-generation non-volatile memory.

MRAM uses a resistance change caused by a change in magnetization direction to record data. In order to realize an increase in capacity of a recording memory, studies of reducing the size of elements constituting the memory and of multi-leveling the recording bits per element constituting the memory have been performed.

Japanese Unexamined Patent Application, First Publication No. 2016-157815 and Japanese Unexamined Patent Application, First Publication No. 2016-178252 disclose a domain wall moving element. The domain wall moving element is used as a sensor in Japanese Unexamined Patent Application No. 2016-157815 and is used as a data recording element in Japanese Unexamined Patent Application No. 2016-178252. For example, when the domain wall moving element is used as the recording element, the domain wall moving element records information in an analog manner according to the position of the magnetic domain wall. The position of the magnetic domain wall is controlled by a switching element connected to a magnetic domain wall moving portion.

SUMMARY OF INVENTION

The domain wall moving element is used as a magnetic recording array in which a plurality of domain wall moving elements are integrated and is particularly used as a sum product calculation array in many cases. In the case of the application as the sum product calculation array, a resistance area product (RA) of an element is required to be increased in order to particularly reduce consumption power. The magnetic recording array includes a control unit with a switching element and a wiring and a domain wall moving element. After the control unit is provided, a plurality of the domain wall moving elements are provided at a predetermined position of the control unit. However, a part of the plurality of domain wall moving elements may fail after the magnetic recording array is manufactured.

The present disclosure has been made in view of the above-described circumstances and an object of the present disclosure is to provide a magnetic recording array capable of preventing a failure of a domain wall moving element at the time of manufacture.

That is, according to a first aspect of the present disclosure, there is provided the following method.

(1) A magnetic recording array according to the first aspect includes: a plurality of domain wall moving elements; a first wiring which is electrically connected to a reference potential and is electrically connected to at least one domain wall moving element of the plurality of domain wall moving elements; a second wiring which is electrically connected to at least two or more domain wall moving elements of the plurality of domain wall moving elements; a first switching element which is connected between each of the domain wall moving elements and the first wiring; and a second switching element which is connected between each of the domain wall moving elements and the second wiring, wherein each of the domain wall moving elements includes a magnetic recording layer which is electrically connected to the first wiring and the second wiring and includes a magnetic domain wall, a first ferromagnetic layer, and a non-magnetic layer which is located between the first ferromagnetic layer and the magnetic recording layer, wherein an OFF resistance of the first switching element is smaller than an OFF resistance of the second switching element, and wherein a resistance area product (RA) of the domain wall moving element is $1 \times 10^5$ $\Omega \mu m^2$ or more.

(2) In the magnetic recording array according to the above-described aspect, the OFF resistance of the first switching element may be smaller than a resistance value of the non-magnetic layer.

(3) A magnetic recording array according to a second aspect includes: a plurality of domain wall moving elements; a first wiring which is electrically connected to a reference potential and is electrically connected to at least one domain wall moving element of the plurality of domain wall moving elements; a second wiring which is electrically connected to at least two or more domain wall moving elements of the plurality of domain wall moving elements; a first switching element which is connected between each of the domain wall moving elements and the first wiring; and a second switching element which is connected between each of the domain wall moving elements and the second wiring, wherein each of the domain wall moving elements includes a magnetic recording layer which is electrically connected to the first wiring and the second wiring and includes a magnetic domain wall, a first ferromagnetic layer, and a non-magnetic layer which is located between the first ferromagnetic layer and the magnetic recording layer, wherein an OFF resistance of the first switching element is smaller than an OFF resistance of the second switching element, and wherein the OFF resistance of the first switching element is smaller than a resistance value of the non-magnetic layer.

(4) In the magnetic recording array according to the above-described aspect, the first wiring may be grounded.

(5) The magnetic recording array according to the above-described aspect may further include: a substrate which supports the first switching element and the second switching element and is exposed on the outside and the first wiring may be electrically connected to the substrate.

(6) In the magnetic recording array according to the above-described aspect, the first switching element and the second switching element may be transistors.

(7) A magnetic recording device according to a third aspect includes: first memory element and second memory element each of which includes a first ferromagnetic layer, a second ferromagnetic layer, and a non-magnetic layer interposed between the first ferromagnetic layer and the second ferromagnetic layer; a first switching element which is electrically connected to at least one second ferromagnetic layer of one of the first memory element and the second memory element; a first conductive portion which is electrically connected to the first switching element and a predetermined potential; a second switching element which is electrically connected to the second ferromagnetic layers of both of the first memory element and the second memory element, an electric resistance thereof in an OFF state being higher than an electric resistance of the first switching element; and a second conductive portion which is electrically connected to the second switching element, wherein a resistance area product of the first memory element is $1\times10^5$ $\Omega\mu m^2$ or more, and wherein a resistance area product of the second memory element is $1\times10^5$ $\Omega\mu m^2$ or more.

(8) In the magnetic recording device according to the above-described aspect, the first switching element and the second switching element may be transistors.

(9) In the magnetic recording device according to the above-described aspect, the first switching element and the second switching element may be formed in a semiconductor layer, and each of the first memory element and second memory element may be formed on each of insulation layer formed on the first switching element and the second switching element.

According to the magnetic recording array of the above-described aspect, it is possible to prevent a failure of the domain wall moving element at the time of manufacture.

DESCRIPTION OF EMBODIMENTS

Figure 1:
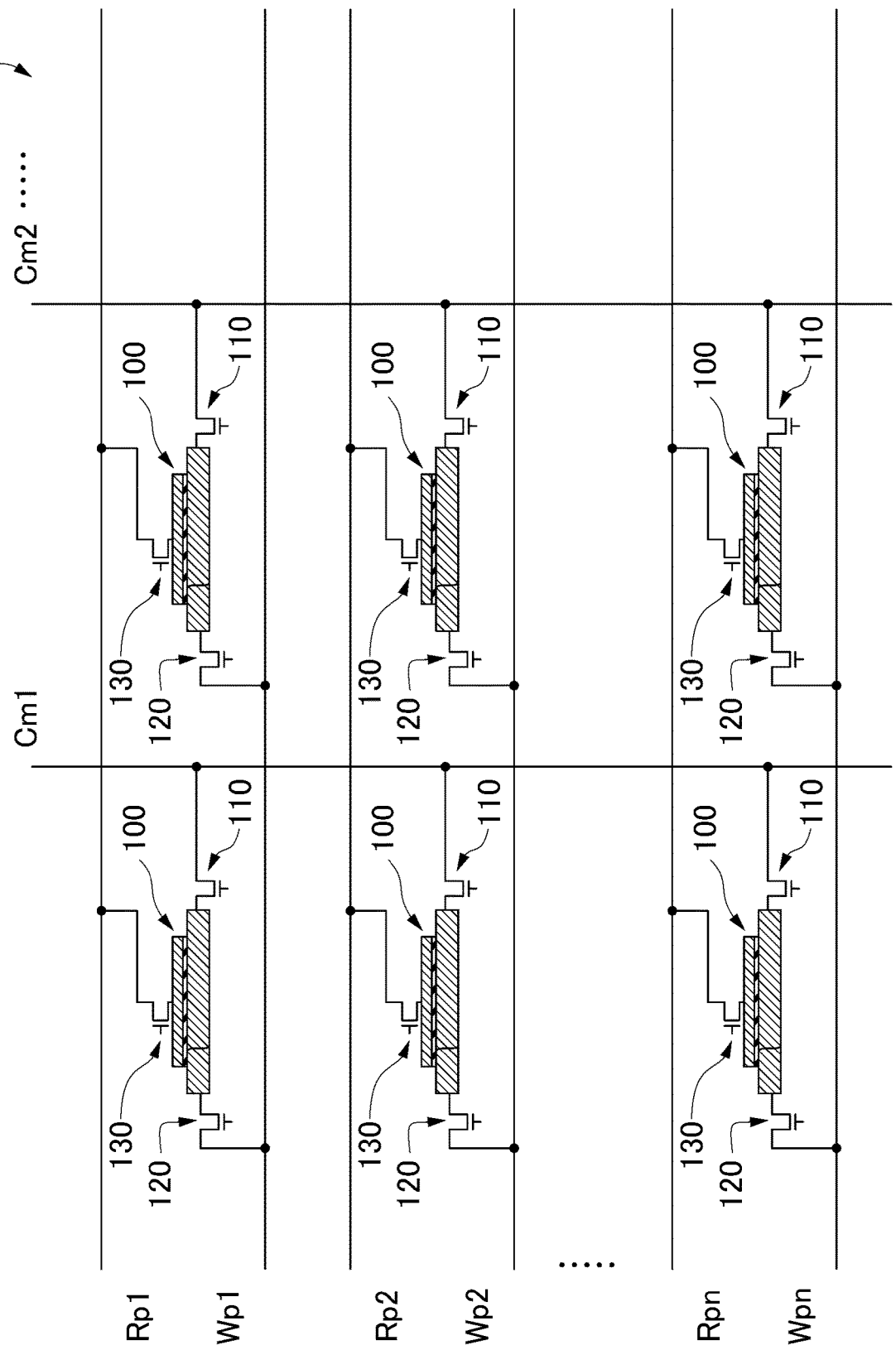
FIG. 1 is a circuit diagram schematically showing an example of a circuit of a magnetic recording array according to a first embodiment.

Hereinafter, a preferred example of the embodiment will be described with reference to the drawings in detail. In the drawings used in the following description, characteristic parts may be enlarged and a dimensional ratio of each component may be different from an actual one for convenience in order to easily understand the characteristics of the present disclosure. The materials, dimensions, and the like exemplified in the following description are merely examples and the present disclosure is not limited to them. That is, appropriate modifications can be made within the scope of the effect of the present disclosure. For example, it is possible to omit, add, or change the numbers, numerical values, amounts, ratios, characteristics, and the like without departing from the spirit of the present disclosure.

(Magnetic Recording Array)

FIG. 1 is a circuit diagram schematically showing an example of a circuit of a magnetic recording array 200 according to a first embodiment. The magnetic recording array 200 includes a plurality of domain wall moving elements 100, first wirings Cm1 to Cmn, second wirings Wp1 to Wpn, third wirings Rp1 to Rpn, a first switching element 110, a second switching element 120, and a third switching element 130. The magnetic recording array is an example of a magnetic recording device. The first wiring, the second wiring, and the third wiring are respectively examples of a first conductive portion, a second conductive portion, and a third conductive portion.

<First Wiring, Second Wiring, and Third Wiring>

The first wirings Cm1 to Cmn correspond to a common wiring. The common wiring is a wiring which is used to write and read data. The first wirings Cm1 to Cmn are electrically connected to a reference potential. For example, when the first wirings Cm1 to Cmn are grounded, the reference potential becomes a ground. Further, the first wirings Cm1 to Cmn are connected to at least one domain wall moving element 100 among the plurality of domain wall moving elements 100. The first wirings Cm1 to Cmn may be respectively provided in the plurality of domain wall moving elements 100 or may be provided across the plurality of domain wall moving elements 100. Although the present disclosure is not limited thereto, for example, the first wiring Cm1 may be provided in one domain wall moving element 100, the first wiring Cm2 may be provided in one domain wall moving element 100 in which the first wiring Cm1 is not provided, and the first wiring Cm3 may be provided across a plurality of domain wall moving elements 100. Further, for example, the first wiring Cm1 and the second wiring Cm2 may be provided in the same domain wall moving element 100. A combination of the first wirings Cm1 to Cmn and the plurality of domain wall moving elements 100 may be an arbitrary combination.

The second wirings Wp1 to Wpn are writing wirings. The second wirings Wp1 to Wpn are electrically connected to at least two or more domain wall moving elements 100 among the plurality of domain wall moving elements 100. The second wirings Wp1 to Wpn are connected to a power supply at the time of using the magnetic recording array 200. The second wirings Wp1 to Wpn are not connected to a power supply at the time of manufacturing the magnetic recording array 200 and the potentials of the second wirings Wp1 to Wpn are floating potentials.

The third wirings Rp1 to Rpn are reading wirings. The third wirings Rp1 to Rpn are electrically connected to at least one or more domain wall moving elements 100 among the plurality of domain wall moving elements 100. The third wirings Rp1 to Rpn are connected to a power supply at the time of using the magnetic recording array 200. The third wirings Rp1 to Rpn are not connected to a power supply at the time of manufacturing the magnetic recording array 200 and the potentials of the third wirings Rp1 to Rpn are floating potentials. That is, the potentials of the third wirings Rp1 to Rpn are floating potentials at the time of manufacturing the magnetic recording array 200.

<First Switching Element, Second Switching Element, and Third Switching Element>

The first switching element 110 is connected between each of the domain wall moving elements 100 and the first wirings Cm1 to Cmn. The second switching element 120 is connected between each of the domain wall moving elements 100 and the second wirings Wp1 to Wpn. The third switching element 130 is connected between each of the domain wall moving elements 100 and the third wirings Rp1 to Rpn.

When the first switching element 110 and the second switching element 120 are turned on, a writing current flows between the first wirings Cm1 to Cmn and the second wirings Wp1 to Wpn connected to a plurality of predetermined domain wall moving element 100. When the first switching element 110 and the third switching element 130 are turned on, a reading current flows between the first wirings Cm1 to Cmn and the third wirings Rp1 to Rpn connected to a predetermined domain wall moving element 100. Here, a case in which the switching element is turned on means a case in which the switching element is electrically connected to a circuit.

The first switching element 110, the second switching element 120, and the third switching element 130 are elements which control a current flow. For example, as the first switching element 110, the second switching element 120, and the third switching element 130, those using a phase change of a crystal layer, those using a change of a band structure like a metal-insulator transition (MIT) switch, those using a breakdown voltage such as a zener diode and an avalanche diode, or those using a conductivity change with a change of an atomic position can be used. That is, the first switching element 110, the second switching element 120, and the third switching element 130 are not limited to these examples and, for example, an element such as a transistor or an Ovonic Threshold Switch (OTS) can be used.

The OFF resistance of the first switching element 110 is smaller than the OFF resistance of the second switching element 120. Further, the OFF resistance of the first switching element 110 is preferably smaller than a resistance value of a non-magnetic layer 30 to be described later. Here, the OFF resistance means a resistance value in a state in which a voltage is not applied. The OFF resistance means, for example, a resistance of the first switching element 110 and a resistance of the second switching element 120 during a manufacturing process.

The second switching element 120 and the third switching element 130 may be shared by the domain wall moving element 100 connected to one of the second wirings Wp1 to Wpn or one of the third wirings Rp1 to Rpn. For example, one second switching element 120 may be provided at the upstream side of any second wiring Wpn. Further, for example, one third switching element 130 may be provided at the upstream side of any third wiring Rpn. It is possible to select a specific domain wall moving element 100 by switching an ON/OFF state of the first switching element 110 connected to each domain wall moving element 100.

<Domain Wall Moving Element>

Figure 2:
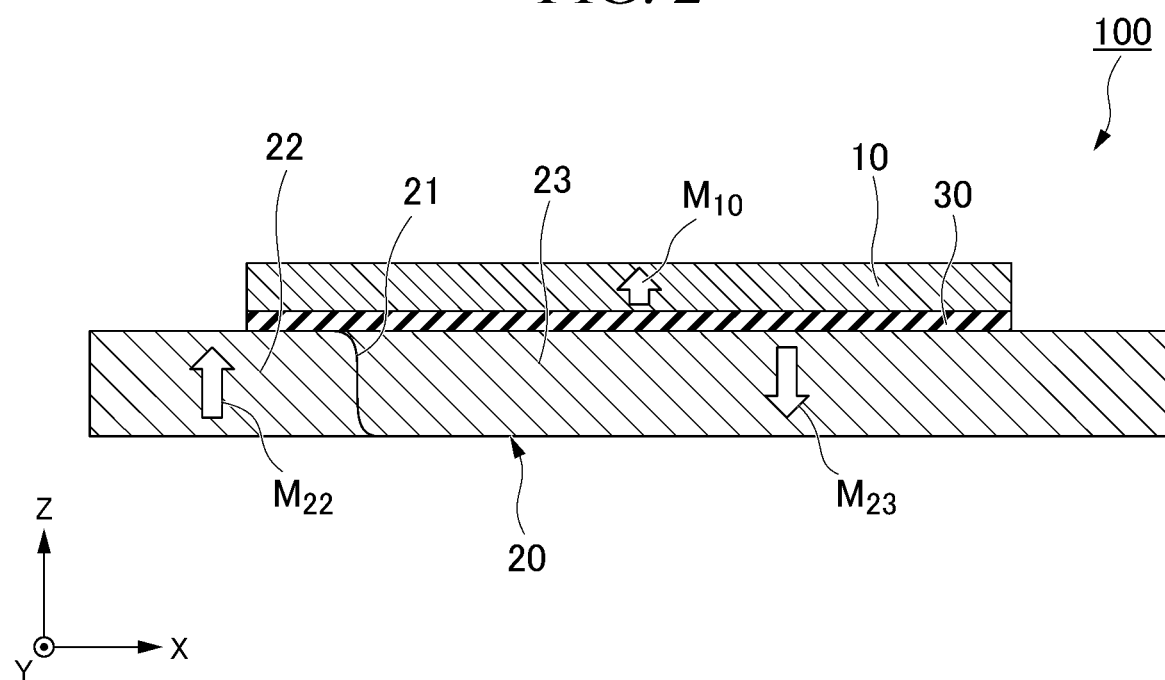
FIG. 2 is a schematic cross-sectional view schematically showing an example of a cross-section of a domain wall moving element of the magnetic recording array according to the first embodiment.

FIG. 2 is a schematic cross-sectional view schematically showing an example of a cross-section of the domain wall moving element of the magnetic recording array according to the first embodiment. The domain wall moving element 100 includes a first ferromagnetic layer 10, a magnetic recording layer 20, and a non-magnetic layer 30. Hereinafter, a direction in which the magnetic recording layer 20 extends is referred to as the x direction, a direction intersecting (for example, substantially orthogonal to) the x direction within a plane having the magnetic recording layer 20 is referred to as the y direction, and a direction intersecting (for example, substantially orthogonal to) the x direction and the y direction is referred to as the z direction. The z direction is, for example, a lamination direction of the non-magnetic layer 30 and the first ferromagnetic layer 10 with respect to the magnetic recording layer 20.

(Magnetic Recording Layer)

The magnetic recording layer 20 extends in the x direction. The magnetic recording layer 20 includes a magnetic domain wall 21 provided therein. The magnetic domain wall 21 is a boundary between a first magnetic domain 22 and a second magnetic domain 23 having magnetizations in opposite directions. The magnetic domain wall moving element 100 shown in FIG. 2 has a magnetization in which the first magnetic domain 22 is oriented in the +z direction and the second magnetic domain 23 is oriented in the −z direction.

In FIG. 2, a description will be made by using an example in which a magnetization is oriented in the z direction. The magnetizations of the magnetic recording layer 20 and the first ferromagnetic layer 10 may be oriented in the x direction or may be oriented in other directions.

The domain wall moving element 100 records data as multiple values or continuously by the position of the magnetic domain wall 21 of the magnetic recording layer 20. The data recorded in the magnetic recording layer 20 is read as a change in resistance value of the domain wall moving element 100 when a reading current is applied.

A ratio between the first magnetic domain 22 and the second magnetic domain 23 of the magnetic recording layer 20 changes when the magnetic domain wall 21 moves. The magnetization Mio of the first ferromagnetic layer 10 is the same direction as (parallel to) the magnetization $M_{22}$ of the first magnetic domain 22 and is a direction opposite to (anti-parallel to) the magnetization $M_{23}$ of the second magnetic domain 23. When the magnetic domain wall 21 moves in the +x direction so that the area of the first magnetic domain 22 in a portion overlapping the first ferromagnetic layer 10 in the plan view from the z direction increases, the resistance value of the domain wall moving element 100 decreases. In contrast, when the magnetic domain wall 21 moves in the −x direction so that the area of the second magnetic domain 23 in a portion overlapping the first ferromagnetic layer 10 in the plan view from the z direction increases, the resistance value of the domain wall moving element 100 increases.

The magnetic domain wall 21 moves by allowing a writing current to flow in the extension direction of the magnetic recording layer 20 or applying an external magnetic field. The magnetic recording layer 20 is connected to the first wirings Cm1 to Cmn and the second wirings Wp1 to Wpn. For example, when a writing current (for example, a current pulse) is applied in the +x direction of the magnetic recording layer 20, the magnetic domain wall 21 moves. At this time, electrons flow in the −x direction opposite to the direction of the current. When a current flows from the first magnetic domain 22 toward the second magnetic domain 23, electrons spin-polarized by the first magnetic domain 23 reverse the magnetization $M_{22}$ of the first magnetic domain 22. Since the magnetization $M_{22}$ of the first magnetic domain 22 is reversed, the magnetic domain wall 21 moves.

The magnetic recording layer 20 is formed by a magnetic material. As the magnetic material forming the magnetic recording layer 20, metal selected from a group consisting of Cr, Mn, Co, Fe, and Ni, alloy containing one or more of these metals, and alloy containing these metals and at least one or more elements of B, C, and N can be used. Specifically, Co—Fe, Co—Fe—B, and Ni—Fe can be exemplified.

The magnetic recording layer 20 preferably contains at least one element selected from a group consisting of Co, Ni, Pt, Pd, Gd, Tb, Mn, Ge, and Ga. As a material used in the magnetic recording layer 20, for example, a laminated film of Co and Ni, a laminated film of Co and Pt, a laminated film of Co and Pd, a MnGa-based material, a GdCo-based material, and a TbCo-based material can be exemplified. A ferrimagnetic material such as a MnGa-based material, a GdCo-based material, and a TbCo-based material has a small saturation magnetization and can reduce a threshold current required to move the magnetic domain wall. Further, the laminated film of Co and Ni, the laminated film of Co and Pt, and the laminated film of Co and Pd have a high coercivity and therefore it is possible to suppress a moving speed of the magnetic domain wall.

(First Ferromagnetic Layer)

The first ferromagnetic layer 10 is a magnetization fixed layer. The magnetization fixed layer is a layer which is formed of a magnetic material and of which a magnetization direction is difficult to change as compared with the magnetic recording layer 20 when a predetermined external force is applied thereto. The predetermined external force is, for example, an external force which is applied to the magnetization due to an external magnetic field or an external force which is applied to the magnetization due to a spin polarization current.

The first ferromagnetic layer 10 contains a ferromagnetic material. As the ferromagnetic material forming the first ferromagnetic layer 10, for example, metal selected from a group consisting of Cr, Mn, Co, Fe, and Ni, alloy containing one or more of these metals, and alloy containing these metals and at least one or more elements of B, C, and N can be used. Specifically, Co—Fe, Co—Fe—B, and Ni—Fe can be exemplified.

A material forming the first ferromagnetic layer 10 may be Heusler alloy. The Heusler alloy is half metal and has high spin polarization. The Heusler alloy is an intermetallic compound having a chemical composition of XYZ or $X_2YZ$. Here, X is a transition metal element or noble metal element of Co, Fe, Ni, or Cu group on a periodic table, Y is a transition metal element of Mn, V, Cr, or Ti group or an elemental species of X, and Z is a typical element of group III to group V. The Heusler alloy is not limited to this example and, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like can be exemplified.

The film thickness of the first ferromagnetic layer 10 is preferably 1.5 nm or less and more preferably 1.0 nm or less when the easy axis of magnetization of the first ferromagnetic layer 10 is the z direction (in the case of a perpendicular magnetization film). When the film thickness of the first ferromagnetic layer 10 is thin, it is possible to add perpendicular magnetic anisotropy (interface perpendicular magnetic anisotropy) to the first ferromagnetic layer 10 at the interface between the first ferromagnetic layer 10 and the other layer (the non-magnetic layer 30). Further, when the film thickness of the first ferromagnetic layer 10 is thin, the magnetization of the first ferromagnetic layer 10 can be easily oriented in the z direction.

As an example, the magnetization of the first ferromagnetic layer 10 is fixed in the z direction. When the magnetization is fixed in the z direction, the first ferromagnetic layer 10 is preferably a laminated structure of a ferromagnetic material selected from a group consisting of Co, Fe, and Ni and a non-magnetic material selected from a group consisting of Pt, Pd, Ru, and Rh. Further, when the magnetization is fixed in the z direction, it is more preferable to insert a non-magnetic material selected from a group consisting of Ir and Ru as an intermediate layer at any position of the laminated structure. When the ferromagnetic material and the non-magnetic material are laminated, perpendicular magnetic anisotropy can be added. When the intermediate layer is further inserted, the magnetization of the ferromagnetic layer 10 can be more strongly fixed in the perpendicular direction.

The domain wall moving element 100 may include an anti-ferromagnetic layer which is provided on a surface opposite to the non-magnetic layer 30 of the first ferromagnetic layer 10 with a spacer layer interposed therebetween. When antiferromagnetic coupling is formed between the first ferromagnetic layer 10 and the anti-ferromagnetic layer, the coercivity of the first ferromagnetic layer 10 increases. The anti-ferromagnetic layer is, for example, IrMn, PtMn, or the like. The spacer layer contains, for example, at least one selected from a group consisting of Ru, Ir, and Rh.

(Non-Magnetic Layer)

The non-magnetic layer 30 is formed by, for example, an insulator. The non-magnetic layer 30 preferably contains at least one element selected from a group consisting of Mg, Al, and Si. The non-magnetic layer 30 is, for example, $Al_2O_3$, $SiO_2$, MgO, or $MgAl_2O_4$. A part of Al, Si, and Mg may be replaced by Zn, Be, or the like. These materials have a large band gap and are excellent in insulation.

The thickness of the non-magnetic layer 30 is desirably 20 Å or more and more preferably 30 Å or more. When the thickness of the non-magnetic layer 30 is thick, the resistance area product (RA) of the domain wall moving element 100 increases. The resistance area product (RA) of the domain wall moving element 100 is preferably $1\times10^5$ $\Omega\mu m^2$ or more, more preferably $5\times10^5$ $\Omega m^2$ or more, and further preferably $1\times10^6$ $\Omega\mu m^2$ or more. The resistance area product (RA) of the domain wall moving element 100 is expressed by the product of the element resistance of one domain wall moving element 100 and the element cross-sectional area of the domain wall moving element 100 (the area of the cut surface obtained by cutting the non-magnetic layer 30 along the xy plane).

In the magnetic recording array 200, the domain wall moving elements 100 are integrated. A total current of currents respectively flowing to the domain wall moving elements 100 at the time of writing and reading data is applied to the entire magnetic recording array 200. When the amount of the current flowing in each domain wall moving element 100 increases, the amount of the current applied to the entire magnetic recording array 200 increases too much. When the resistance area product (RA) of the domain wall moving element 100 is large, the amount of currents respectively flowing to the domain wall moving elements 100 decreases. That is, the total current applied to the magnetic recording array 200 decreases and the power consumption of the magnetic recording array 200 decreases.

Figure 3:
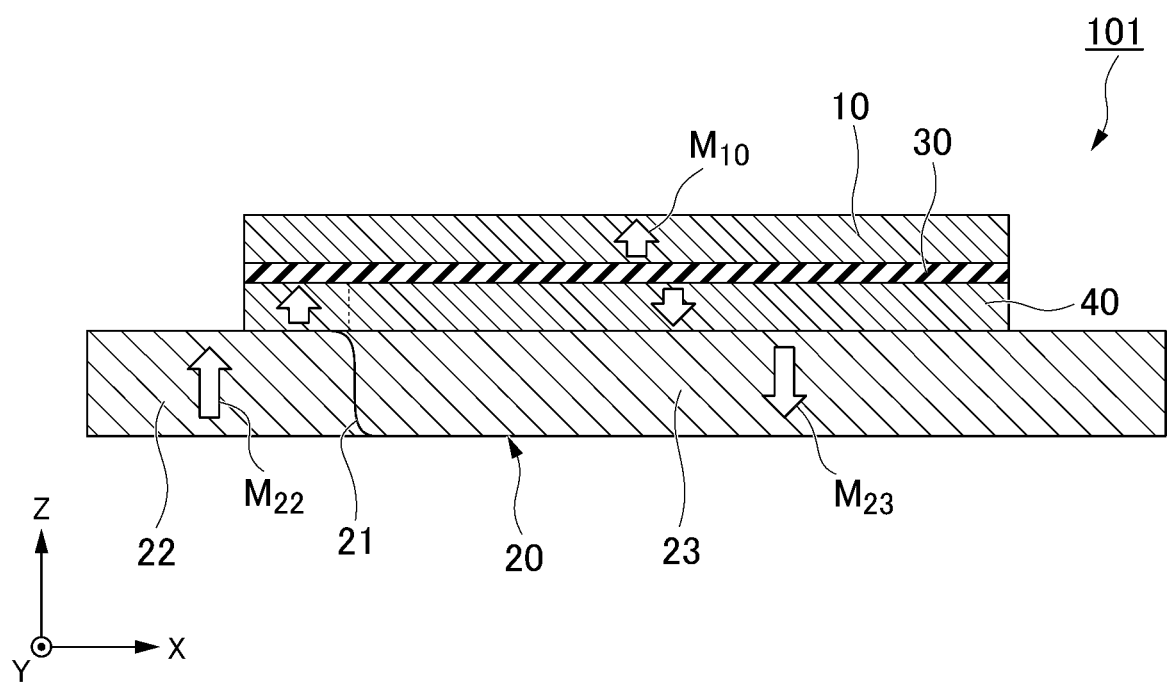
FIG. 3 is a schematic cross-sectional view schematically showing an example of a cross-section of another example of the domain wall moving element of the magnetic recording array according to the first embodiment.

The domain wall moving element 100 shown in FIG. 2 is an example and may have another configuration. FIG. 3 is a schematic cross-sectional view schematically showing a cross-section of another example of the domain wall moving element of the magnetic recording array according to the first embodiment. A domain wall moving element 101 shown in FIG. 3 is different from the domain wall moving element 100 shown in FIG. 2 in that a second ferromagnetic layer 40 is provided between the magnetic recording layer 20 and the non-magnetic layer 30. The second ferromagnetic layer 40 reflects the magnetic state of the magnetic recording layer 20.

The second ferromagnetic layer 40 contains a magnetic material. As the magnetic material constituting the second ferromagnetic layer 40, the same one as that of the first ferromagnetic layer 10 can be used.

The second ferromagnetic layer 40 is adjacent to the magnetic recording layer 20. The magnetization of the second ferromagnetic layer 40 is magnetically coupled to the magnetization of the magnetic recording layer 20. The magnetic coupling mentioned herein means a magnetically coupled state. The second ferromagnetic layer 40 reflects the magnetic state of the magnetic recording layer 20. When the second ferromagnetic layer 40 and the magnetic recording layer 20 are ferromagnetically coupled to each other, the magnetic state of the second ferromagnetic layer 40 becomes the same as the magnetic state of the magnetic recording layer 20. When the second ferromagnetic layer 40 and the magnetic recording layer 20 are antiferromagnetically coupled to each other, the magnetic state of the second ferromagnetic layer 40 becomes opposite to the magnetic state of the magnetic recording layer 20.

The MR ratio of the domain wall moving element 101 is caused by a change in magnetic state between two magnetic materials (the first ferromagnetic layer 10 and the second ferromagnetic layer 40) interposing the non-magnetic layer 30. The second ferromagnetic layer 40 preferably contains a material that can easily obtain coherent tunneling with the first ferromagnetic layer 10.

Meanwhile, the magnetic recording layer 20 preferably contains a material that slows down the moving speed of the magnetic domain wall 21. In the case of the domain wall moving element 100 shown in FIG. 2, the magnetic recording layer 20 is one of two magnetic materials interposing the non-magnetic layer 30. In the case of the domain wall moving element 100 shown in FIG. 2, the magnetic recording layer 20 preferably contains a material that can decrease the moving speed of the domain wall 21 and improve the MR ratio of the domain wall moving element 100. In contrast, in the case of the domain wall moving element 101 shown in FIG. 3, the magnetic recording layer 20 is not two magnetic materials interposing the non-magnetic layer 30. In the case of the domain wall moving element 101 shown in FIG. 3, a material constituting the magnetic recording layer 20 has a less influence on the MR ratio of the domain wall moving element 101. Thus, the domain wall moving element 101 shown in FIG. 3 has a high degree of freedom in selecting the material of the magnetic recording layer 20.

Figure 4:
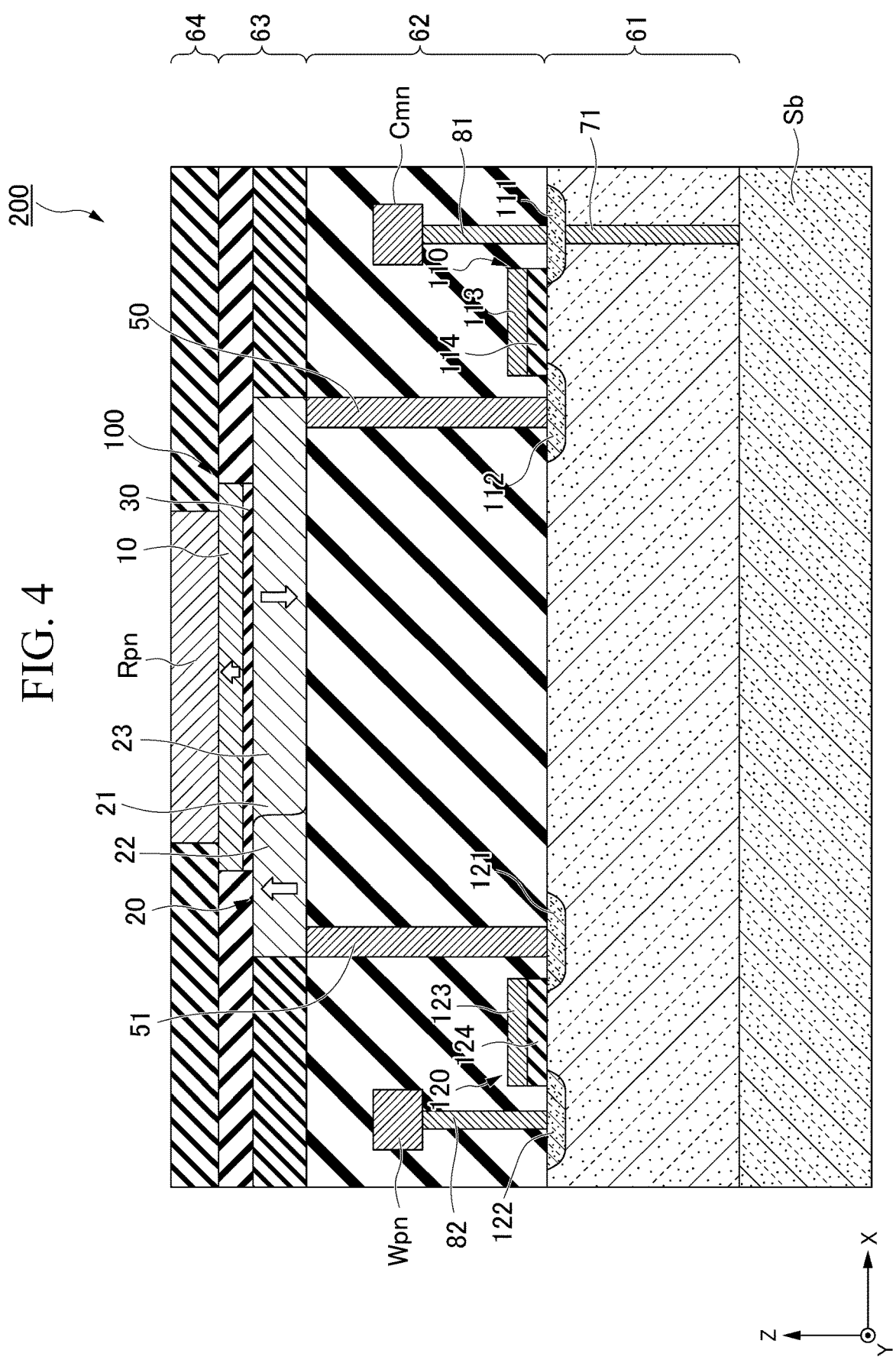
FIG. 4 is a configuration diagram schematically showing an example of a configuration of the magnetic recording array according to the first embodiment.

FIG. 4 is a configuration diagram schematically showing an example of a configuration of the magnetic recording array according to the first embodiment. FIG. 4 is an image diagram which is used to easily understand a connection relationship of components of the magnetic recording array 200. The domain wall moving element 101 may be used instead of the domain wall moving element 100.

FIG. 4 shows an example of a case in which the first switching element 110 and the second switching element 120 are field effect transistors (FETs). The first switching element 110 and the second switching element 120 include source areas 112 and 122, drain areas 111 and 121, gate electrodes 113 and 123, and gate insulation films 114 and 124.

As shown in FIG. 1, the magnetic recording array 200 includes the domain wall moving element 100, the first wirings Cm1 to Cmn, the second wirings Wp1 to Wpn, the third wirings Rp1 to Rpn, the first switching elements 110, the second switching elements 120, and the third switching elements 130. For example, the first wiring Cmn is disposed in a vertical direction of the drawing so as to connect the plurality of drain areas 111 respectively connected to the domain wall moving elements 100. For example, the second wiring Wpn is disposed in a vertical direction of the drawing so as to connect the plurality of source areas 122 respectively connected to the domain wall moving elements 100. For example, the third wiring Rpn is disposed in a vertical direction of the drawing so as to connect the first ferromagnetic layers 10 of the plurality of domain wall moving elements 100. The third switching element 130 (not shown) is disposed at a position different from that of the drawing.

Next, an example of a method of manufacturing the magnetic recording array 200 will be described with reference to FIG. 4. First, a substrate Sb is prepared. The substrate Sb is, for example, a semiconductor substrate. The substrate Sb is a support medium for manufacturing the first switching element 110 and the second switching element 120. The substrate Sb is exposed to the outside. When the substrate Sb is grounded, the substrate Sb becomes a ground. That is, when the substrate Sb is grounded, the substrate Sb has a reference potential for a circuit operation.

A first layer 61 is laminated on one surface of the substrate Sb. As the first layer 61, for example, an interlayer insulation film, a semiconductor layer, or the like is used. The first layer 61 may be one in which a semiconductor layer provided with the first switching element 110 and the second switching element 120 is laminated on an interlayer insulation film on which a wiring and the like are disposed. That is, the semiconductor layer is a part of the substrate Sb.

A via wiring 71 is formed in the z direction of the first layer 61. The via wiring 71 is processed by photolithography or the like. The via wiring 71 is manufactured by processing a via hole and filling the via hole with a conductive material. The via wiring 71 is connected to the first wiring Cmn via the drain area 111 and a via wiring 81 to be described at the time of manufacture. The via wiring 71 connects the first wiring Cmn and the substrate Sb to each other at the time of manufacture. The via wiring 72 sets the first wiring Cmn and the substrate Sb to the same potential. The via wiring 71 sets first and second surfaces of the first layer 61 to the same potential. The via wiring 71 prevents a charge from being stored in the first layer 61. The first wiring Cmn is electrically connected to the substrate Sb to become a reference potential. The via wiring 71 does not need to be provided in each of the plurality of domain wall moving elements 100 constituting the magnetic recording array 200. When the via wiring is provided in any one domain wall moving element 100, the substrate Sb and the first wiring Cmn are set to the same potential.

A transistor is formed by implanting impurity ions to a part of the first layer 61. The resistance value of the transistor can be changed by adjusting the doping amount of impurities. For example, when the surface of the first layer 61 is a p-type semiconductor layer, an n-type impurity is doped. A portion which is doped with the n-type impurity becomes the source areas 112 and 122 and the drain areas 111 and 121 of the first switching element 110 and the second switching element 120. The source area 112 and the drain area 111 of the first switching element 110 are doped with impurities more than the source area 122 and the drain area 121 of the second switching element 120. The OFF resistance of the first switching element 110 becomes smaller than the OFF resistance of the second switching element 120. Further, a diffusion layer of the first switching element 110 may be doped more than a diffusion layer of the second switching element 120. The OFF resistance of the first switching element 110 becomes smaller than the OFF resistance of the second switching element 120.

The gate insulation films 114 and 124 and the gate electrodes 113 and 123 are laminated on a surface opposite to the substrate Sb of the first layer 61. The gate insulation films 114 and 124 and the gate electrodes 113 and 123 are formed to cover a region between the source areas 112 and 122 and the drain areas 111 and 121. The gate insulation films 114 and 124 and the gate electrodes 113 and 123 may be manufactured by using sputtering or the like through a mask or may be patterned by etching after forming a layer.

Next, a second layer 62 is laminated on a surface opposite to the substrate Sb of the first layer 61. The second layer 62 covers the gate insulation films 114 and 124 and the gate electrodes 113 and 123. The second layer 62 is an interlayer insulation film which is located between the first layer 61 and a third layer 63. The second layer 62 uses, for example, $SiO_2$, $SiN_x$, or the like. For example, the first wiring Cmn and the second wiring Wpn are disposed inside the second layer 62. The first wiring Cmn and the second wiring Wpn are processed by photolithography or the like.

Via wirings 50, 51, 81, and 82 are formed inside the second layer 62. The via wiring 50 is formed at a position overlapping the source area 112 of the first switching element 110. The via wiring 51 is formed at a position overlapping the drain area 121 of the second switching element 120. The via wiring 81 is formed at a position overlapping the drain area 111 of the first switching element 110. The via wiring 82 is formed at a position overlapping the source area 122 of the second switching element 120. The via wiring 81 connects the first wiring Cmn and the drain area 111. The via wiring 82 connects the second wiring Wpn and the source area 122. The via wirings 50, 51, 81, and 82 are manufactured by processing a via hole and filling the via hole with a conductive material.

Next, the domain wall moving element 100 is manufactured on the surface of the second layer 62. The ferromagnetic layer, the non-magnetic layer, and the ferromagnetic layer are sequentially laminated on the second layer 62. The magnetic recording layer 20, the non-magnetic layer 30, and the first ferromagnetic layer 10 are obtained by processing laminated layers using photolithography or the like. The third layer 63 is obtained by covering the periphery of the domain wall moving element 100 with an interlayer insulation film.

Finally, the third wiring Rpn is manufactured on one surface of the first ferromagnetic layer 10. A fourth layer 64 is obtained by covering the periphery of the third wiring Rpn with an interlayer insulation film.

In the magnetic recording array according to the first embodiment, since the OFF resistance of the first switching element 110 is smaller than the OFF resistance of the second switching element 120, it is possible to prevent a failure of the domain wall moving element 100 at the time of manufacture. This reason will be described.

In many cases, the resistance area product (RA) of the domain wall moving element 100 increases in order to prevent the power consumption of the magnetic recording array 200. A main factor of the resistance area product (RA) of the domain wall moving element 100 is the non-magnetic layer 30. The non-magnetic layer 30 which has a large resistance tends to store charge like a capacitor. The domain wall moving element 100 performs various processing steps. For example, when modifying a processed surface, the processed surface is irradiated with plasma. When plasma processing is performed, charges are stored in the non-magnetic layer 30. When a charge is stored in the non-magnetic layer 30, there is a case in which an abnormal voltage is applied to the domain wall moving element 100 and the domain wall moving element 100 fails.

At the time of manufacture, the second wirings Wp1 to Wpn are not connected to a power supply. That is, the potentials of the second wirings Wp1 to Wpn are floating. That is, the potentials of the second wirings Wp1 to Wpn are floating potentials. In contrast, the first wirings Cm1 to Cmn are connected to a reference potential.

When the OFF resistance of the second switching element 120 is smaller than the OFF resistance of the first switching element 110, a part of charges stored in the non-magnetic layer 30 flow toward the second wirings Wp1 to Wpn. As shown in FIG. 1, the second wirings Wp1 to Wpn are electrically connected to at least two or more domain wall moving elements 100 of the plurality of domain wall moving elements 100. Charges stored in the non-magnetic layer 30 of a certain domain wall moving element 100 flow toward another domain wall moving element 100 through the second wirings Wp1 to Wpn. Meanwhile, since the potentials of the second wirings Wp1 to Wpn are floating potentials, charges are not removed from the magnetic recording array 200.

In contrast, when the OFF resistance of the first switching element 110 is smaller than the OFF resistance of the second switching element 120, charges stored in the non-magnetic layer 30 flow toward the side of first wirings Cm1 to Cmn. The potentials of the first wirings Cm1 to Cmn are reference potentials. Charges are efficiently removed through the first wirings Cm1 to Cmn. Thus, charges are not stored in the magnetic recording array 200 and the failure of the domain wall moving element 100 due to an abnormal voltage can be prevented.

When the OFF resistance of the first switching element 110 is smaller than the resistance value of the non-magnetic layer 30, charges stored in the first switching element 110 become smaller than charges stored in the non-magnetic layer 30. For that reason, charges are efficiently removed through the first switching element 110 and the first wirings Cm1 to Cmn. Thus, charges are not stored in the magnetic recording array 200 and the failure of the domain wall moving element 100 due to an abnormal voltage can be prevented.

The domain wall moving element 100 can record analog data instead of digital signals of "1" and "0". Accordingly, the magnetic recording array 200 can be applied to a neuromorphic device or the like which simulates brain.

While preferred embodiments of the invention have been described above, it should be understood that these are exemplary of the invention and are not to be considered as limiting to these embodiments. Modifications, substitutions, and the like can be made without departing from the scope of the present disclosure which are claimed in the present disclosure.

REFERENCE SIGNS LIST

10 First ferromagnetic layer
20 Magnetic recording layer
21 Magnetic domain wall
22 First magnetic domain
23 Second magnetic domain
30 Non-magnetic layer
40 Second ferromagnetic layer
50, 51, 71, 81, 82 Via wiring
61 First layer
62 Second layer
63 Third layer
64 Fourth layer
100, 101 Domain wall moving element
110 First switching element
120 Second switching element
130 Third switching element
111, 121 Drain area
112, 122 Source area
113, 123 Gate electrode
114, 124 Gate insulation film
200 Magnetic recording array
Cm1 to Cmn First wiring
Wp1 to Wpn Second wiring
Rp1 to Rpn Third wiring
Sb Substrate

The invention claimed is:

1. A magnetic recording array comprising:
a plurality of domain wall moving elements;
a first wiring which is electrically connected to a reference potential and is electrically connected to at least one domain wall moving element of the plurality of domain wall moving elements;
a second wiring which is electrically connected to at least two or more domain wall moving elements of the plurality of domain wall moving elements;
a first switching element which is connected between each of the domain wall moving elements and the first wiring; and
a second switching element which is connected between each of the domain wall moving elements and the second wiring,
wherein each of the domain wall moving elements includes a magnetic recording layer which is electrically connected to the first wiring and the second wiring and includes a magnetic domain wall, a first ferromagnetic layer, and a non-magnetic layer which is located between the first ferromagnetic layer and the magnetic recording layer,
wherein an OFF resistance of the first switching element is smaller than an OFF resistance of the second switching element, and
wherein a resistance area product (RA) of the domain wall moving element is $1 \times 10^5$ $\Omega\mu m^2$ or more.

2. The magnetic recording array according to claim 1, wherein the OFF resistance of the first switching element is smaller than a resistance value of the non-magnetic layer.

3. The magnetic recording array according to claim 1, wherein the first wiring is grounded.

4. The magnetic recording array according to claim 1, further comprising:
a substrate which supports the first switching element and the second switching element and is exposed to an outside,
wherein the first wiring is electrically connected to the substrate.

5. The magnetic recording array according to claim 1, wherein the first switching element and the second switching element are transistors.

6. A magnetic recording array comprising:
a plurality of domain wall moving elements;
a first wiring which is electrically connected to a reference potential and is electrically connected to at least one domain wall moving element of the plurality of domain wall moving elements;
a second wiring which is electrically connected to at least two or more domain wall moving elements of the plurality of domain wall moving elements;
a first switching element which is connected between each of the domain wall moving elements and the first wiring; and
a second switching element which is connected between each of the domain wall moving elements and the second wiring,
wherein each of the domain wall moving elements includes a magnetic recording layer which is electrically connected to the first wiring and the second wiring and includes a magnetic domain wall, a first ferromagnetic layer, and a non-magnetic layer which is located between the first ferromagnetic layer and the magnetic recording layer,
wherein an OFF resistance of the first switching element is smaller than an OFF resistance of the second switching element, and
wherein the OFF resistance of the first switching element is smaller than a resistance value of the non-magnetic layer.

7. The magnetic recording array according to claim 6, wherein the first wiring is grounded.

8. The magnetic recording array according to claim 7, further comprising:
a substrate which supports the first switching element and the second switching element and is exposed to the outside,
wherein the first wiring is electrically connected to the substrate.

9. The magnetic recording array according to claim 7, wherein the first switching element and the second switching element are transistors.

10. A magnetic recording device comprising:
first memory element and second memory element each of which includes a first ferromagnetic layer, a second ferromagnetic layer, and a non-magnetic layer interposed between the first ferromagnetic layer and the second ferromagnetic layer;
a first switching element which is electrically connected to at least one second ferromagnetic layer of one of the first memory element and the second memory element;
a first conductive portion which is electrically connected to the first switching element and a predetermined potential;
a second switching element which is electrically connected to the second ferromagnetic layers of both of the first memory element and the second memory element, an electric resistance thereof in an OFF state being higher than an electric resistance of the first switching element; and
a second conductive portion which is electrically connected to the second switching element,
wherein a resistance area product of the first memory element is $1 \times 10^5$ $\Omega\mu m^2$ or more, and
wherein a resistance area product of the second memory element is $1 \times 10^5$ $\Omega\mu m^2$ or more.

11. The magnetic recording device according to claim 10, wherein the first switching element and the second switching element are transistors.

12. The magnetic recording device according to claim 11, wherein the first switching element and the second switching element are formed in a semiconductor layer, and
each of the first memory element and second memory element is formed on each of insulation layer formed on the first switching element and the second switching element.

* * * * *